(12) United States Patent
Kim et al.

(10) Patent No.: US 8,630,124 B2
(45) Date of Patent: Jan. 14, 2014

(54) NONVOLATILE MEMORY DEVICES HAVING MEMORY CELL ARRAYS WITH UNEQUAL-SIZED MEMORY CELLS AND METHODS OF OPERATING SAME

(75) Inventors: Moosung Kim, Yongin-si (KR); Sungsoo Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 324 days.

(21) Appl. No.: 13/035,369

(22) Filed: Feb. 25, 2011

(65) Prior Publication Data
US 2011/0222348 A1 Sep. 15, 2011

(30) Foreign Application Priority Data
Mar. 9, 2010 (KR) .................. 10-2010-0020797

(51) Int. Cl.
*G11C 11/40* (2006.01)
(52) U.S. Cl.
USPC ............ 365/185.24; 365/185.18; 365/185.17; 365/185.19; 365/185.22; 365/185.26; 365/184
(58) Field of Classification Search
USPC ............ 365/185.17, 185.18, 185.19, 185.22, 365/185.24, 185.26, 184
See application file for complete search history.

(56) References Cited

U.S. PATENT DOCUMENTS

| | | | |
|---|---|---|---|
| 5,411,905 A * | 5/1995 | Acovic et al. ............... | 438/156 |
| 7,177,199 B2 | 2/2007 | Chen et al. | |
| 7,646,664 B2 | 1/2010 | Cho et al. | |
| 2002/0011623 A1 * | 1/2002 | Furuhata .................. | 257/315 |
| 2008/0205163 A1 | 8/2008 | Park et al. | |

FOREIGN PATENT DOCUMENTS

| | | |
|---|---|---|
| JP | 2008-210503 | 9/2008 |
| KR | 1020060070734 A | 6/2006 |
| KR | 1020060115996 A | 11/2006 |
| KR | 100673020 B1 | 1/2007 |
| KR | 1020080079572 A | 9/2008 |

* cited by examiner

*Primary Examiner* — Hoai V Ho
*Assistant Examiner* — Jay Radke
(74) *Attorney, Agent, or Firm* — Myers Bigel Sibley & Sajovec, P.A.

(57) ABSTRACT

Nonvolatile memory devices include a two-dimensional array of nonvolatile memory cells having a plurality of memory cells of unequal size therein. These memory cells may include those that have unequal channel widths associated with respective word lines and those having unequal channel lengths associated with respective bit lines that are connected to corresponding strings of nonvolatile memory cells (e.g., NAND-type strings). Control circuitry is also provided that is electrically coupled to the two-dimensional array of nonvolatile memory cells. This control circuitry may operate to concurrently program first and second nonvolatile memory cells having unequal sizes from an erased state (e.g., logic 1) to an equivalent programmed state (e.g., logic 0). This is done by establishing unequal first and second word line-to-channel region voltages in the first and second nonvolatile memory cells, respectively, during an operation to program a row of memory cells in the two-dimensional array of nonvolatile memory cells, which includes the first and second nonvolatile memory cells of unequal size.

12 Claims, 11 Drawing Sheets

NONVOLATILE MEMORY DEVICES HAVING MEMORY CELL ARRAYS WITH UNEQUAL-SIZED MEMORY CELLS AND METHODS OF OPERATING SAME

REFERENCE TO PRIORITY APPLICATION

This application claims priority to Korean Patent Application No. 10-2010-0020797 filed Mar. 9, 2010, the contents of which are hereby incorporated herein by reference.

FIELD

This invention relates to semiconductor memory devices and, more particularly, to nonvolatile memory devices.

BACKGROUND

Semiconductor memory devices are a vital microelectronic component commonly found in digital logic systems, such as computers, and microprocessor-based applications ranging from satellites to consumer electronics. Therefore, advances in the fabrication of semiconductor memory devices, including process enhancements and circuit-design-related developments that allow scaling to higher memory densities and faster operating speeds, help establish performance standards for other digital logic families.

Semiconductor memory devices generally include volatile memory devices, such as random access memory (RAM) devices, and nonvolatile memory devices. In RAM devices, data is stored by either establishing the logic state of a bistable flip-flop such as in a static random access memory (SRAM), or by charging a capacitor in a dynamic random access memory (DRAM). In both SRAM and DRAM devices, data remains stored and may be read as long as the power is applied, but data is lost when the power is turned off.

Mask read-only memory (MROM), programmable read-only memory (PROM), erasable programmable read-only memory (EPROM), and electrically erasable programmable read-only memory (EEPROM) devices are capable of storing data even with the power turned off. The non-volatile memory data storage state may be permanent or reprogrammable, depending upon the fabrication technology used. Non-volatile semiconductor memories are used to store program and microcode storage in a wide variety of applications in the computer, avionics, telecommunications, and consumer electronics industries. A combination of single-chip volatile as well as non-volatile memory storage modes is also available in devices such as non-volatile SRAM (nvRAM) for use in systems that require fast, reprogrammable non-volatile memory. In addition, dozens of special memory architectures have evolved which contain some additional logic circuitry to optimize their performance for application-specific tasks.

Mask read-only memory (MROM), programmable read-only memory (PROM) and erasable programmable read-only memory (EPROM) are not free to erase and rewrite so it is not easy to update the contents of the memory. On the other hand, electrically erasable programmable read-only memory (EEPROM) devices are electrically erasable and writable and may be readily applied to auxiliary memories or system programming memories that require continuous update.

SUMMARY

Nonvolatile memory devices according to embodiments of the invention include a two-dimensional array of nonvolatile memory cells (e.g., EEPROM cells) having a plurality of memory cells of unequal size therein. These memory cells may include memory cells having unequal channel widths and memory cells having unequal channel lengths. In particular, the memory cells may include those that have unequal channel widths associated with a corresponding word line and those having unequal channel lengths associated with a corresponding bit line, which is associated with a corresponding string of nonvolatile memory cells (e.g., NAND-type string). Control circuitry is also provided that is electrically coupled to the two-dimensional array of nonvolatile memory cells. This control circuitry may operate to concurrently program first and second nonvolatile memory cells having unequal sizes from an erased state (e.g., logic 1) to an equivalent programmed state (e.g., logic 0). This is done by establishing unequal first and second word line-to-channel region voltages in the first and second nonvolatile memory cells, respectively, during an operation to program a row of memory cells in the two-dimensional array of nonvolatile memory cells, which includes the first and second nonvolatile memory cells of unequal size.

According to additional embodiments of the invention, the first and second nonvolatile memory cells are electrically coupled to first and second bit lines, respectively, which are biased at unequal bit line voltages during the operation to program. Moreover, the first nonvolatile memory cell may be formed to have a narrower channel width relative to the second nonvolatile memory cell and the first word line-to-channel region voltage may be greater than the second word line-to-channel region voltage during the operation to program.

According to still further embodiments of the invention, the first and second pluralities of nonvolatile memory cells in first and second rows of the two-dimensional array of nonvolatile memory cells, respectively, are electrically coupled to first and second word lines having unequal widths.

According to still further embodiments of the invention, methods of operating nonvolatile memory devices are provided, which include programming first and second nonvolatile memory cells having unequal channel widths in a first row of an array of nonvolatile memory cells from respective erased states to respective first programmed states. Operations are also performed to read the programmed first and second nonvolatile memory cells using a first read verify voltage (e.g., Vvfy1_Si) to verify that the first nonvolatile memory cell has a threshold voltage associated with its first programmed state and a second read verify voltage (Vvfy2_Si), which is greater than or less than the first read verify voltage, to verify that the second nonvolatile memory cell has a second threshold voltage associated with its first programmed state.

The programming operation may include applying a program voltage to a first word line associated with the first row and the read operations may include applying the first and second read verify voltages in sequence to the first word line. Operations may also be performed to program third and fourth nonvolatile memory cells having unequal channel widths in a second row of the array of nonvolatile memory cells from respective erased states to respective first programmed states. The third and fourth nonvolatile memory cells may have equivalent channel lengths and the first and second nonvolatile memory cells may have equivalent channel lengths, which are greater than or less than the channel lengths of the third and fourth nonvolatile memory cells.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
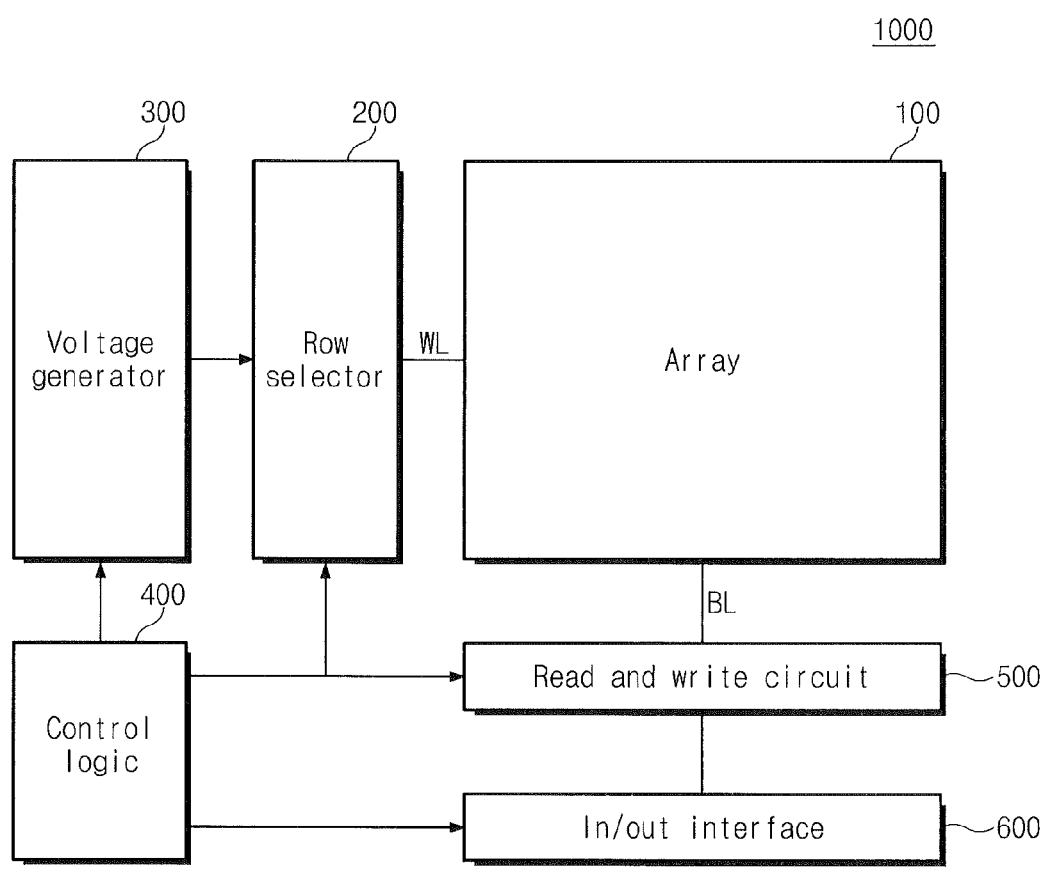
FIG. 1 is a block diagram showing a non-volatile memory device according to an exemplary embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram showing a non-volatile memory device according to an exemplary embodiment of the inventive concept. Referring to FIG. 1, a non-volatile memory device 1000 according to an exemplary embodiment of the inventive concept includes a memory cell array 100 which has memory cells arranged in rows (or, word lines) and columns (or, bit lines). Each memory cell is capable of storing 1-bit data or M-bit (multi-bit) data (M being 2 or more integer). The memory cell array 100 may be formed to have a well-known single-layer array structure (or, a two-dimensional (2D) array structure) or a multi-layer array structure (or, a three-dimensional (3D) array structure). Exemplary 3D array structures are disclosed in U.S. Publication No. 2008/0023747 and U.S. Pat. No. 7,646,664, the entirety of which is incorporated by reference herein.

A row selector circuit 200 is configured to perform selecting and driving of rows of the memory cell array 100. The voltage generator circuit 300 is controlled by control logic 400 and is configured to generate voltages (for example, a program voltage, a pass voltage, an erase voltage, a read voltage, etc.) necessary for program, erase, and read operations. A read and write circuit 500 is controlled by the control logic 400 and operates as a sense amplifier or a write driver depending upon a mode of operation. For example, during a read operation, the read and write circuit 500 operates as a sense amplifier which senses data from memory cells of a selected row. During a program operation, the read and write circuit 500 operates as a write driver which drives memory cells in a selected row according to program data. The read and write circuit 500 may include registers (or, called page buffers) each corresponding to bit lines or bit line pairs. In the event that each memory cell stores multi-bit data, each register of the read and write circuit 500 is configured to have two or more latches. In the event that each memory cell stores single-bit data, each register of the read and write circuit 500 is configured to have one or more latches. An input/output interface 600 is configured to interface with an external device (for example, a memory controller or a host). For example, the input/output interface 600 provides an interface function between the read and write circuit 500/control logic 400 and an external device.

Figure 2:
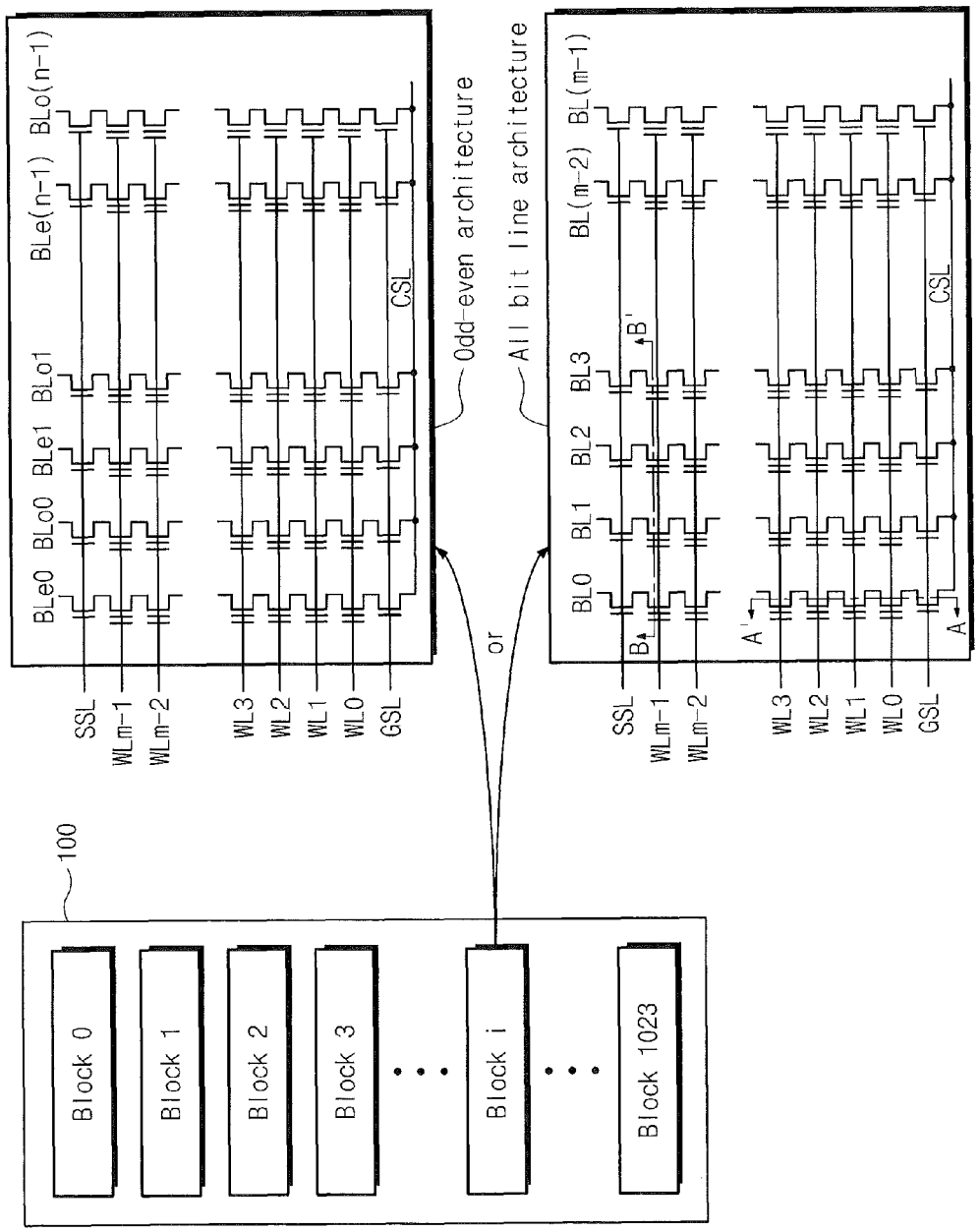
FIG. 2 is a diagram showing a memory cell array having an all bit line memory architecture or an odd-even memory architecture.

FIG. 2 illustrates a diagram showing a memory cell array having the all bit line memory architecture or the odd-even memory architecture. Exemplary structures of a memory cell array 100 will be described. As one example, a NAND flash memory device including a memory cell array 100 partitioned into 1,024 blocks will now be described. The data stored in each block may be simultaneously erased. In one embodiment, the memory block is the minimum unit of storage elements that are simultaneously erased. Each memory block, for example, has columns each corresponding to bit lines (e.g., bit lines of 1 KB). In one embodiment referred to as the all bit line (ABL) architecture, all the bit lines of a memory block are capable of being simultaneously selected during read and program operations. Storage elements in a common word line and connected to all bit lines is capable of being programmed at the same time.

In an exemplary embodiment, a plurality of storage elements in the same column is connected in series to form a NAND string 111. One end of the NAND string 111 is connected to a corresponding bit line via a select transistor which is controlled by a string select line SSL, the other end is connected to a common source line CSL via a select transistor, which is controlled by a ground select line GSL.

In another embodiment referred to as the odd-even architecture, bit lines are divided into even bit lines (BLe) and odd bit lines (BLo). In the odd/even bit line architecture, storage elements in a common word line and connected to the odd bit lines are programmed at the first time, while storage elements in the common word line and connected to even bit lines are programmed at the second time. Data is capable of being programmed and read into and from different blocks. Such operations are capable of being performed at the same time.

Figure 5:
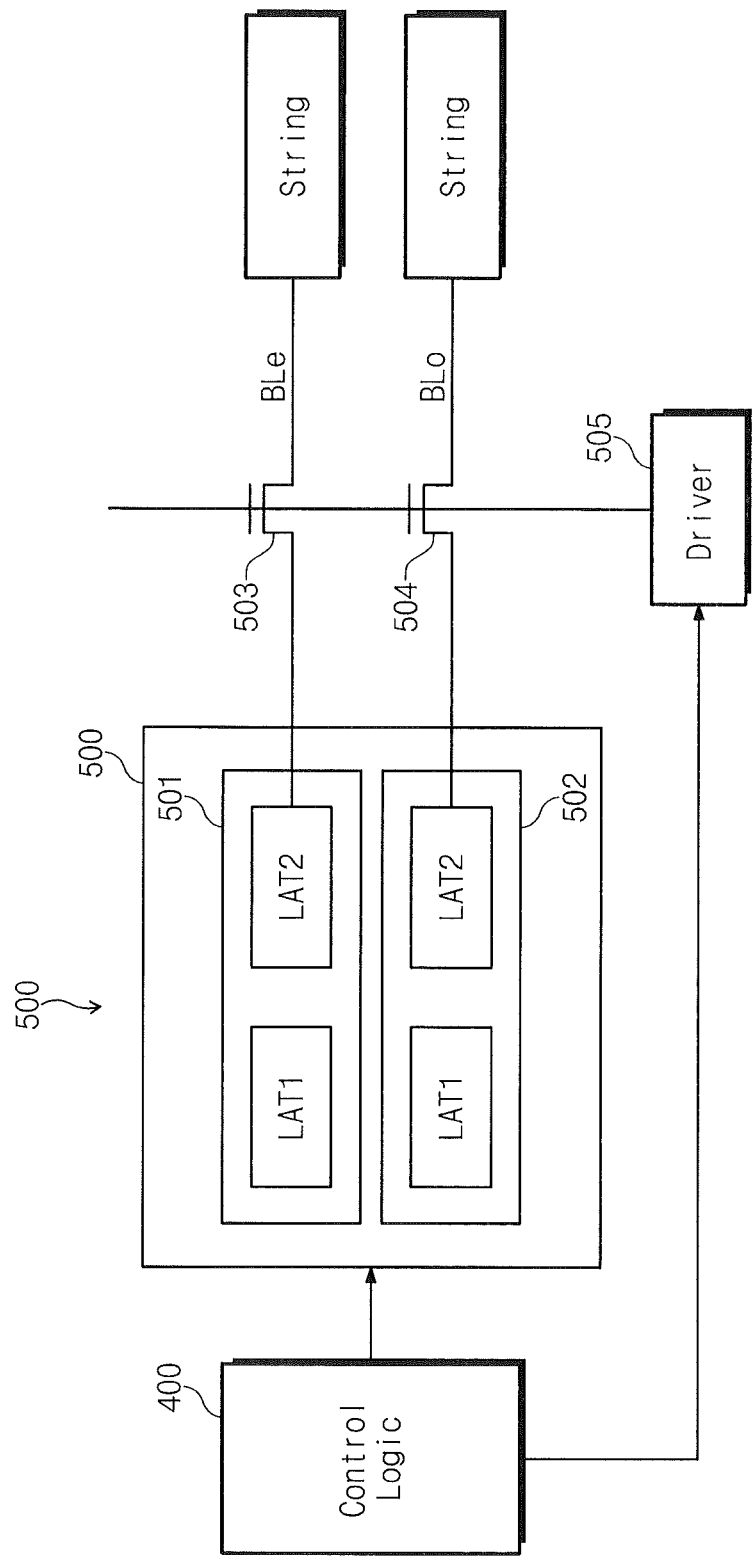
FIG. 5 is a block diagram showing a part of a read and write circuit associated with two bit lines.

In case of the all bit line architecture, bit lines are connected to respective registers (or, called page buffers) in a read and write circuit 500 in FIG. 5. On the other hand, in case of the odd-even architecture, bit lines are formed of a plurality of bit line pairs, each of which is constituted of an even bit line BLei and an odd bit line BLoi. The bit line pairs are connected to respective registers (or, called page buffers) in a read and write circuit 500 in FIG. 5.

In an exemplary embodiment, a non-volatile memory device is capable of being formed to have the all bit line architecture. However, it is comprehended that the odd-even architecture is applied to the non-volatile memory device according to an exemplary embodiment of the inventive concept.

As it is increasingly difficult to form active areas, word lines, and bit lines due to high integration, a memory device has been fabricated using the Double Patterning Technique (DPT). The DPT is a pattern technique for overcoming limitation of photolithography equipments. Active areas, word lines, and bit lines formed by the DPT are illustrated in FIGS. 3A to 3C.

Figure 3A:
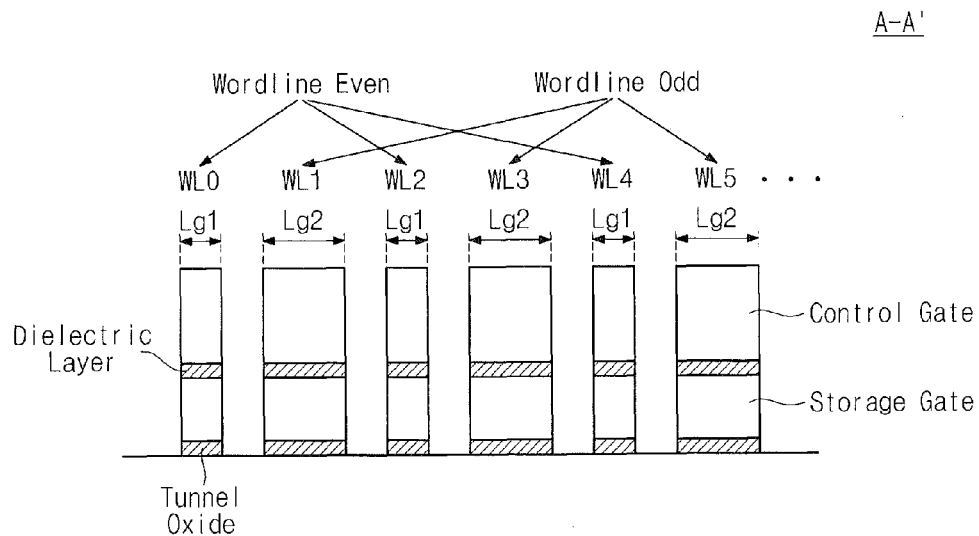
FIG. 3A is a cross-sectional view of a memory cell array cut according to a dotted line A-A' in FIG. 2.
Figure 3B:
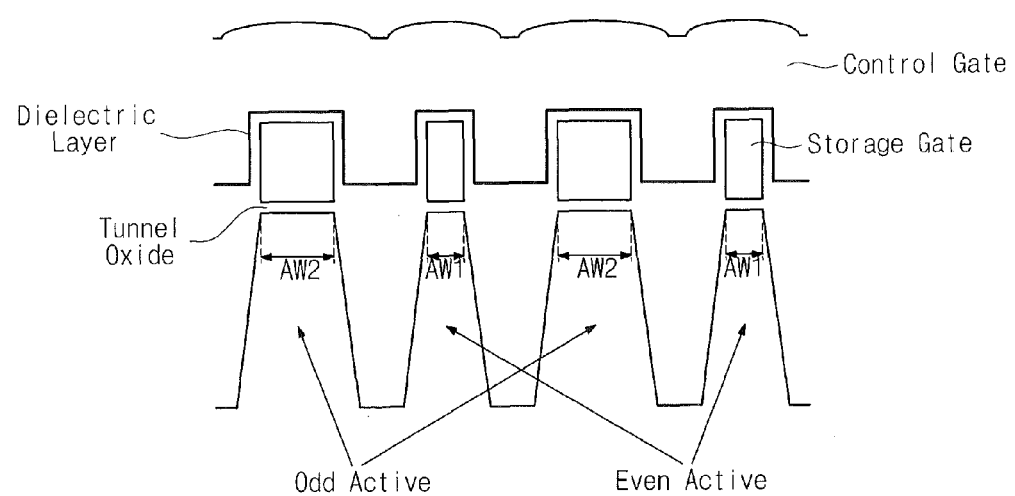
FIG. 3B is a cross-sectional view of a memory cell array cut according to a dotted line B-B' in FIG. 2.
Figure 3C:
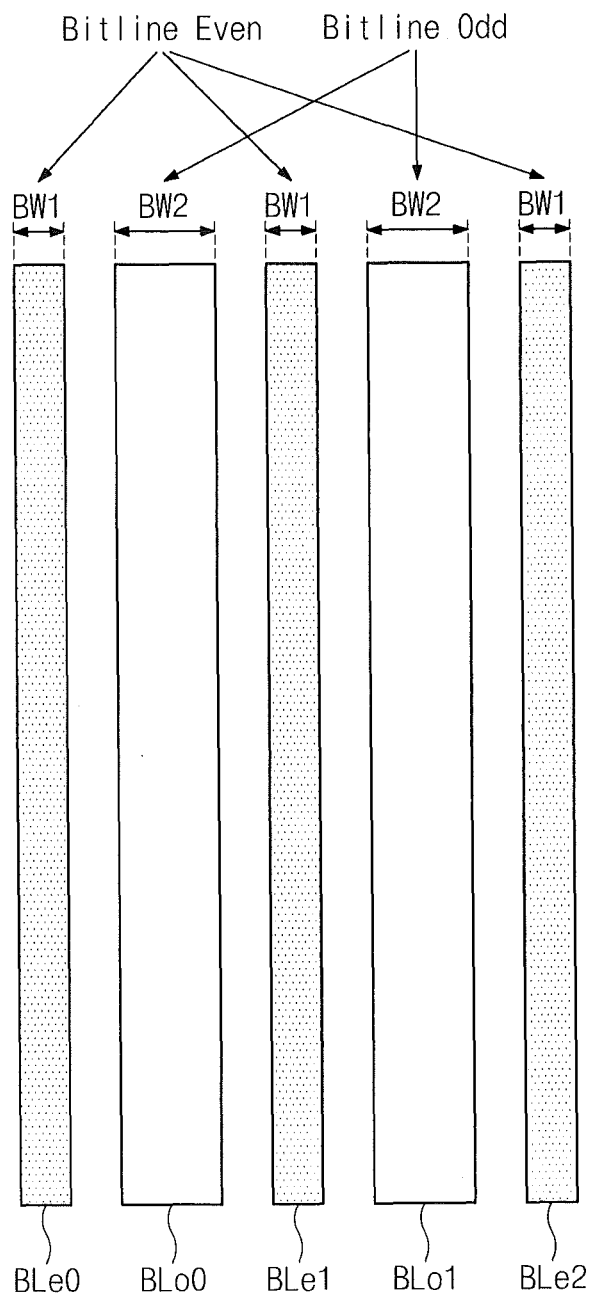
FIG. 3C is a diagram showing widths of even-numbered and odd-numbered bit lines formed according to the double patterning technique.

FIG. 3A is a cross-sectional view of a memory cell array cut according to a dotted line A-A' in FIG. 2, FIG. 3B is a cross-sectional view of a memory cell array cut according to a dotted line B-B' in FIG. 2, and FIG. 3C is a diagram showing widths of even-numbered and odd-numbered bit lines formed according to the double patterning technique.

Referring to FIG. 3A, widths of word lines are different depending upon whether a word line is an even-numbered word line or an odd-numbered word line. For example, widths Lg1 of even-numbered word lines are narrower than widths Lg2 of odd-numbered word lines. As illustrated in FIG. 3B, an active width AW1 of a memory cell corresponding to an even-numbered word line is narrower than an active width AW2 of a memory cell corresponding to an odd-numbered word line. Referring to FIG. 3C, widths BW1 of even-numbered bit lines are narrower than widths BW2 of odd-numbered bit lines. Active areas, word lines, and bit lines illustrated in FIGS. 3A to 3C may be formed by the DPT.

In FIGS. 3A to 3C, terms "even-numbered" and "odd-numbered" are used to indicate an exemplary pattern formation order or whether a pattern width is narrow or wide. Such terms are not used to limit the embodiments to a specific example. In an exemplary embodiment, patterns corresponding to "even-numbered" are capable of being formed prior to patterns corresponding to "odd-numbered". But, it is well understood that patterns corresponding to "even-numbered" are capable of being formed following patterns corresponding to "odd-numbered"

Figure 4:
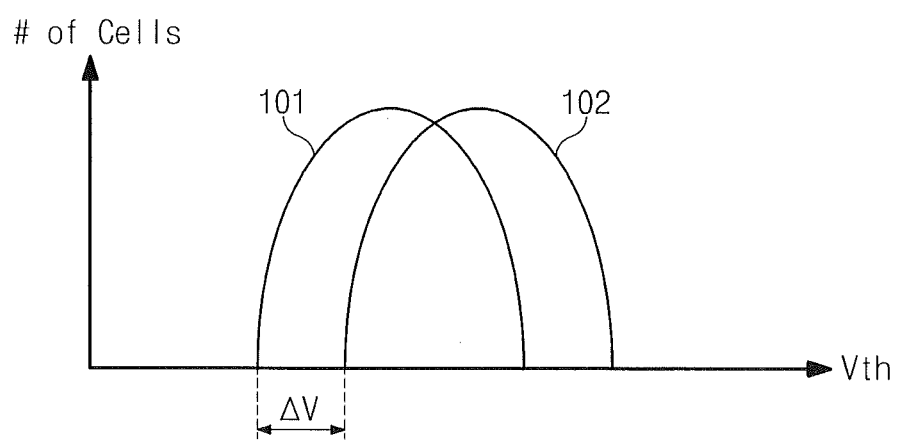
FIG. 4 is a diagram showing a threshold voltage distribution of memory cells fabricated according to the double patterning technique.

In case of forming active areas, word lines, and bit lines by the DPT, a program speed of memory cells corresponding to odd-numbered bit lines is different from a program speed of memory cells corresponding to even-numbered bit lines. This means that a threshold voltage distribution widens. A threshold voltage distribution of memory cells fabricated according to the double patterning technique is illustrated in FIG. 4. A program speed (or, a program characteristic) of memory cells in a threshold voltage distribution 101 is different from a program speed (or, a program characteristic) of memory cells in a threshold voltage distribution 102. As a result, a voltage difference of ΔV exists between the lowermost level of the distribution 101 and the lowermost level of the distribution 102. Distributions 101 and 102 illustrated in FIG. 4 may correspond to one program state. Depending upon a test operation or fabrication results (e.g., a pattern width, an insulation thickness, etc.), it is judged whether a program speed of memory cells of odd-numbered bit lines is faster or slower than a program speed of memory cells of even-numbered bit lines. However, it is comprehended whether judgment manners are not limited to this disclosure. A program characteristic/speed of memory cells in one group may be different from a program characteristic/speed of memory cells in the other group.

FIG. 5 is a block diagram showing a part of a read and write circuit associated with two bit lines. Referring to FIG. 5, bit lines BLe and BLo may be formed according to the above-described Double Patterning Technique. A read and write circuit 500 includes registers 501 and 502 which correspond to the bit lines BLe and BLo, respectively. Each of the registers 501 and 502 may include at least two latches LAT1 and LAT2. Data to be programmed is loaded on the latch LAT1 of each register, and data loaded on the latch LAT1 is dumped to the latch LAT2. Data loading and dumping operations are capable of being executed according to the control of control logic 400. The bit line BLe/BLo is driven with a ground voltage (or, a bit line program voltage) or a power supply voltage (or, a bit line program-inhibition voltage) according to data dumped to the latch LAT2 under the control of the control logic 400. For example, when data of '0' is stored in the latch LAT2 of the register 501, the bit line BLe is set up to a ground voltage through a switch transistor 503. This means that a channel of a string connected to the bit line BLe is grounded. When data of '1' is stored in the latch LAT2 of the register 501, the bit line BLe is set up to a power supply voltage through the switch transistor 503. This means that a channel of a string connected to the bit line BLe is charged up to a voltage of (VCC-Vth) (Vth being a threshold voltage of a string select transistor). The bit lines BLe and BLo and latches LAT2 of the registers 501 and 502 are connected through the switch transistors 503 and 504, respectively. The switch transistors 503 and 504 are controlled by a driver 505.

In an exemplary embodiment, a control voltage to the switch transistors 503 and 504 is determined so as to be sufficient to transfer a power supply voltage to the bit lines BLe and BLo during a bit line setup period. For example, during the bit line setup period, a voltage of about (VCC+Vth) (Vth being a threshold voltage of a switch transistor) is supplied to gates of the switch transistors 503 and 504 by the driver 505. Following the bit line setup operation and prior to a word line enable operation, a voltage (or, a forcing voltage) of about (VCC+Vth) (Vth being a threshold voltage of a switch transistor) is supplied to gates of the switch transistors 503 and 504 by the driver 505. This will be more fully described below. Herein, as illustrated in FIG. 4, ΔV indicates a voltage difference between distributions 101 and 102. The distribution 101 is associated with memory cells whose program speed is relatively slow, and the distribution 102 is associated with memory cells whose program speed is relatively fast.

Figure 6:
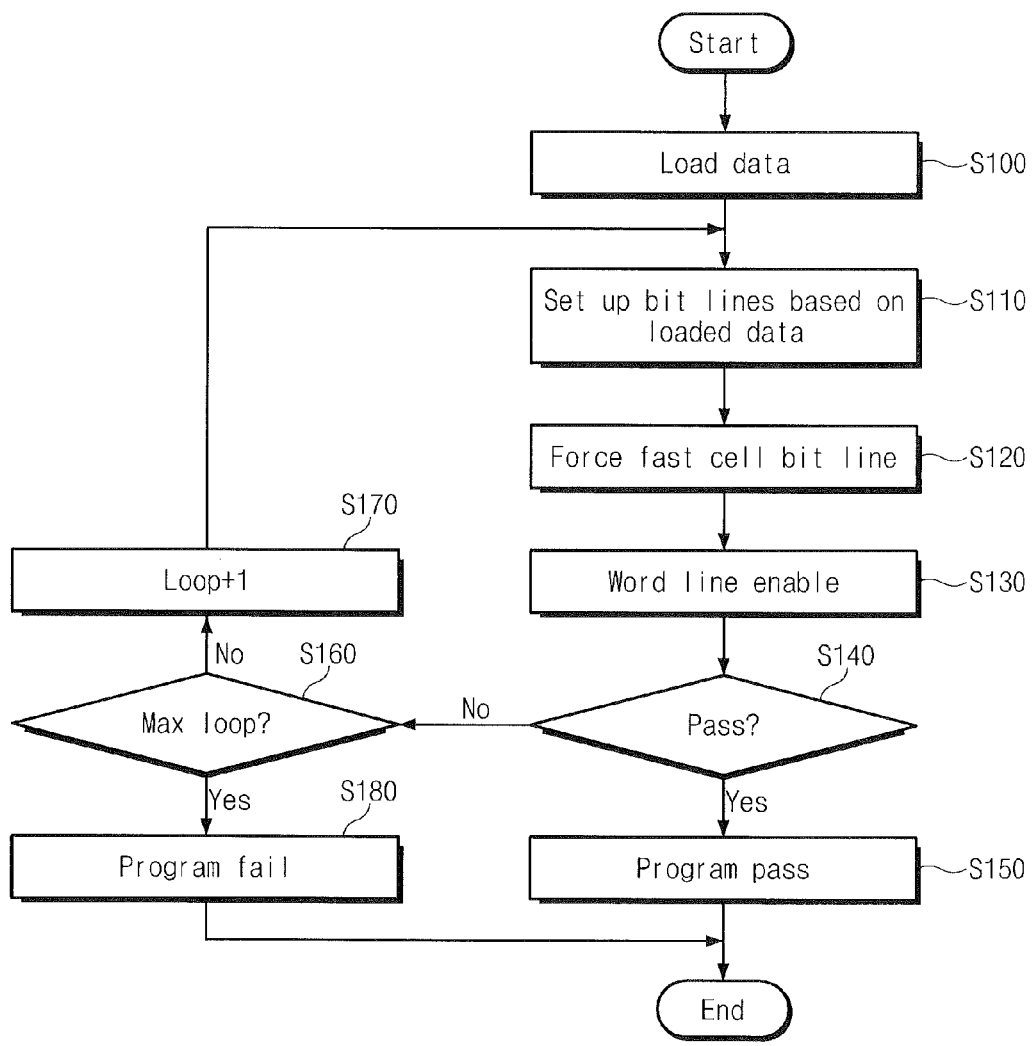
FIG. 6 is a flow chart for describing a program method of a non-volatile memory device according to an exemplary embodiment of the inventive concept.

FIG. 6 is a flow chart for describing a program method of a non-volatile memory device according to an exemplary embodiment of the inventive concept. Below, a program method of a non-volatile memory device according to an exemplary embodiment of the inventive concept will be more fully described with reference to accompanying drawings. A non-volatile memory device 1000 according to an exemplary embodiment of the inventive concept is configured to have the all bit line architecture. This means that bit lines of a memory cell array 100 are connected to corresponding registers, respectively. That is, a program/read operation is performed at the same time with respect to all memory cells connected with a selected word line. For ease of description, a program operation will be described depending upon two bit lines BLe and BLo which are formed by the Double Patterning Technique. As described above, a program speed of a memory cell connected to one bit line BLe is different from that connected to the other bit line BLo. Hereinafter, a bit line connected with a memory cell of a relatively fast program speed is called a "fast cell bit line", and a bit line connected with a memory cell of a relatively slow program speed is called a "slow cell bit line". Judging of a fast cell bit line and a slow cell bit line, for example, is made through a test operation. A program method determined according to the test result is adopted to control logic 400. It is well comprehended that judging of a fast cell bit line and a slow cell bit line is not limited to a memory device fabricated by the Double Patterning Technique. Judging of a fast cell bit line and a slow cell bit line is capable of being accomplished due to various causes.

In step S100, data to be programmed in a memory cell array 100 is loaded onto registers 501 and 502 in a read and write circuit 500 through an input/output interface 600 under the control of control logic 400. The loaded data is stored in latches LAT1 of the registers 501 and 502. Data in the latches LAT1 of the registers 501 and 502 is dumped into latches LAT2 thereof according to the control of the control logic 400. In step S110, bit lines BLe and BLo (refer to FIG. 5) are set up to one of a power supply voltage and a ground voltage, depending upon loaded data of the registers 501 and 502. For example, if loaded data of the registers 501 and 502 is '0', the bit line BLe and BLo are set up to a ground voltage, respectively. At this time, a voltage of (VCC+Vth) is applied to switch transistors 503 and 504 as a control voltage.

In step S120, a fast cell bit line (for example, BLe) is driven with a forcing voltage Vf(=ΔV) under the control of the control logic 400, which is referred to as a bit line forcing operation/period. In particular, in the latches LAT2 of the registers 501 and 502, the latch LAT2 of the register 501 connected with the fast cell bit line (for example, BLe) is set up to data '1' under the control of the control logic 400. At this time, there is no change to the value of the latch LAT2 of the register 501 connected with the slow cell bit line (for example, BLo). Further, a control voltage applied to the switch transistors 503 and 504 is set up to a voltage (for example, ΔV+Vth) which is sufficient to transfer the forcing voltage Vf(=ΔV) to the fast cell bit line BLe. As the latch LAT2 of the register 501 is set up to data '1' and a control voltage applied to the switch transistors 503 and 504 is set up to a voltage (for example, ΔV+Vth) which is sufficient to transfer the forcing voltage Vf(=ΔV), the fast cell bit line BLe is driven with the forcing voltage Vf through the switch transistor 503. This means that a channel of a string connected with the fast cell bit line BLe is charged up to the forcing voltage Vf. Although a control voltage applied to the switch transistors 503 and 504 is set up to a voltage (for example, ΔV+Vth) which is sufficient to transfer the forcing voltage Vf(=ΔV), the slow cell bit line BLo maintains a voltage set up during the bit line setup operation. For example, when data '1' is stored in the latch LAT1, the slow cell bit line BLo maintains a power supply voltage (VCC) set up during the bit line setup operation. When data '0' is stored in the latch LAT1, the slow cell bit line BLo maintains a ground voltage (0V) set up during the bit line setup operation.

After the fast cell bit line BLe is set up to the forcing voltage Vf, in step S130, a word line enable operation is executed according to the well-known manner. For example, during a word line enable period, firstly, all word lines of a selected memory block are driven with a pass voltage, and then a selected word line is driven with a program voltage. Since a channel of a string connected with the fast cell bit line is charged up to the forcing voltage Vf and a channel of a string connected with the slow cell bit line is charged up to a voltage of 0V, a selected memory cell of a string connected with the fast cell bit line is programmed to be relatively slow as compared with a selected memory cell of a string connected with the slow cell bit line. In other words, both a selected memory cell of a string connected with the fast cell bit line and a selected memory cell of a string connected with the slow cell bit line may be programmed in the same program speed. Unlike the description in FIG. 4, a widening of a threshold voltage distribution is suppressed. In other words, the selected memory cells form one threshold voltage distribution even though the odd and even cells associated with a selected word line have different sizes.

In step S140, there is judged whether selected memory cells are programmed to have a required program state. That is, a verify-read operation is executed. If selected memory cells are judged to have a required program state, in step S150, a program operation is passed. Afterwards, the procedure is ended. If selected memory cells are judged not to have a required program state, the procedure goes to step S160, in which there is judged whether a program loop reaches a maximum loop. If a program loop is judged not to reach a maximum loop, in step S170, a program loop number is increased by 1. Afterwards, the procedure goes to S110. If a program loop is judged to reach a maximum loop, in step S180, the program operation is failed. Afterwards, the procedure is ended.

Driving of a bit line to a forcing voltage is capable of being accomplished through various manners. For example, a non-volatile memory device is further provided with an independent voltage generator for generating a forcing voltage, and a read and write circuit 500 is further provided with a circuit which supplies the forcing voltage from the independent voltage generator to the fast cell bit line depending upon data of a latch corresponding to the fast cell bit line.

Figure 7:
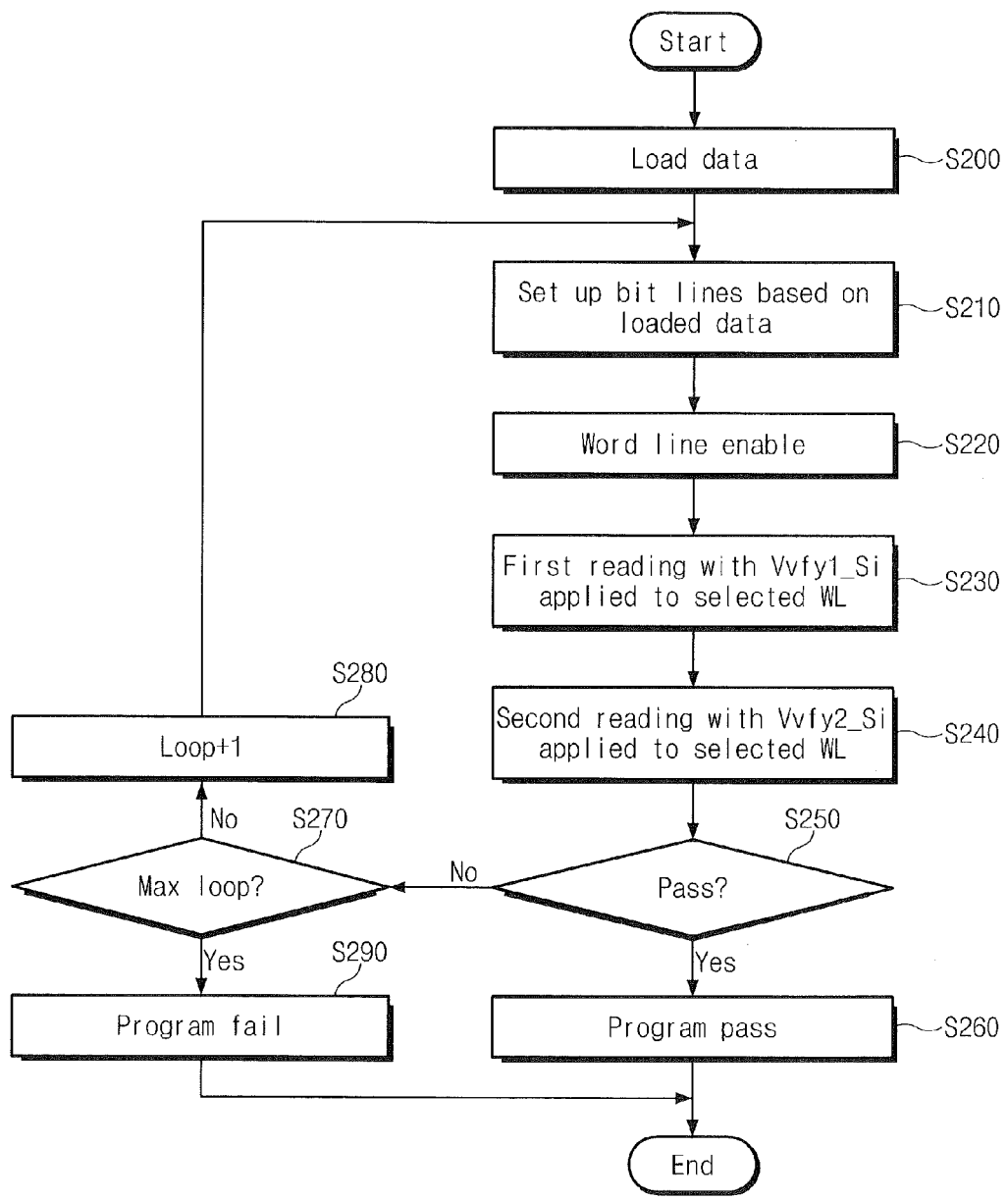
FIG. 7 is a flow chart for describing a program method of a non-volatile memory device according to another exemplary embodiment of the inventive concept.

FIG. 7 is a flow chart for describing a program method of a non-volatile memory device according to another exemplary embodiment of the inventive concept. A non-volatile memory device 1000 according to an exemplary embodiment of the inventive concept is configured to have the all bit line architecture. This means that the bit lines of a memory cell array 100 are connected to corresponding registers, respectively. That is, a program/read operation is performed at the same time with respect to all memory cells connected with a selected word line. For ease of description, a program operation will be described depending upon two bit lines BLe and BLo which are formed by the Double Patterning Technique. As described above, a program speed of a memory cell connected to one bit line BLe is different from that connected to the other bit line BLo. Hereinafter, a bit line connected with a memory cell of a relatively fast program speed is called a "fast cell bit line", and a bit line connected with a memory cell of a relatively slow program speed is called a "slow cell bit line". Judging of a fast cell bit line and a slow cell bit line, for example, is made through a test operation. A program method determined according to the test result is adopted to control logic 400.

In step S200, data to be programmed in a memory cell array 100 is loaded onto registers 501 and 502 in a read and write circuit 500 through an input/output interface 600 under the control of control logic 400. The loaded data is stored in latches LAT1 of the registers 501 and 502. Data in the latches LAT1 of the registers 501 and 502 is dumped into latches LAT2 thereof according to the control of the control logic 400. In step S210, bit lines BLe and BLo (refer to FIG. 5) are set up to one of a power supply voltage and a ground voltage, depending upon loaded data of the registers 501 and 502. For example, if loaded data of the registers 501 and 502 is '0', the bit line BLe and BLo are set up to a ground voltage, respectively. At this time, a voltage of (VCC+Vth) is applied to switch transistors 503 and 504 as a control voltage.

In step S220, a word line enable operation is executed according to the well-known manner. For example, during a word line enable period, firstly, all word lines of a selected memory block are driven with a pass voltage, and then a selected word line is driven with a program voltage. That is, selected memory cells are programmed.

In step S230, a read/sense operation is executed with a first verify voltage Vvfy1_Si from a voltage generator 300 applied to a selected word line. At this time, a register 502 connected with a slow cell bit line BLo performs a sense operation according to the control of the control logic 400, while a register 501 connected with a fast cell bit line BLe does not perform a sense operation according to the control of the control logic 400. In step S240, a read/sense operation is executed with a second verify voltage Vvfy2_Si from the voltage generator 300 applied to the selected word line. At this time, the register 502 connected with the slow cell bit line BLo does not perform a sense operation according to the control of the control logic 400, while the register 501 connected with the fast cell bit line BLe performs a sense operation according to the control of the control logic 400.

Herein, the first and second verify voltages Vvfy1_Si and Vvfy2_Si are generated by the voltage generator 300 according to the control of the control logic 400. It is possible to change the order that the first and second verify voltages Vvfy1_Si and Vvfy2_Si are supplied.

In step S250, there is judged whether selected memory cells are programmed to have a required program state. If selected memory cells are judged to have a required program state, in step S260, a program operation is passed. Afterwards, the procedure is ended. If selected memory cells are judged not to have a required program state, the procedure goes to step S270, in which there is judged whether a program loop reaches a maximum loop. If a program loop is judged not to reach a maximum loop, in step S280, a program loop number is increased by 1. Afterwards, the procedure goes to S210. If a program loop is judged to reach a maximum loop, in step S290, the program operation is failed. Afterwards, the procedure is ended.

Figure 8:
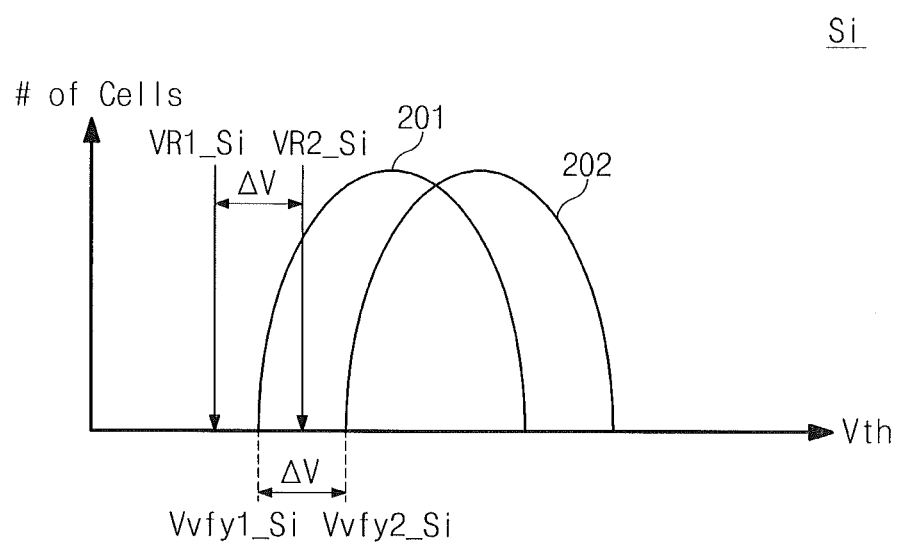
FIG. 8 is a diagram showing threshold voltage distributions formed according to a program method described in FIG. 7.

FIG. 8 is a diagram showing threshold voltage distributions formed according to a program method described in FIG. 7. In the event that memory cells are programmed by a program method described in FIG. 7, as illustrated in FIG. 8, one program state Si is formed of two threshold voltage distributions 201 and 202. The threshold voltage distribution 201 is formed of memory cells of slow cell bit lines on the basis of the verify voltage Vvfy1_Si. The threshold voltage distribution 202 is formed of memory cells of fast cell bit lines on the basis of the verify voltage Vvfy2_Si. In FIG. 8, there is illustrated one program state. However, it is well understood that more program states are distributed according a cell-per-bit number. In this case, each of program states is formed of two threshold voltage distributions on the basis of two verify voltages. Since memory cells of slow cell bit lines and memory cells of fast cell bit lines are program verified independently, a read operation (or, a normal read operation) is also performed independently with respect to memory cells of slow cell bit lines and memory cells of fast cell bit lines. That is, as illustrated in FIG. 8, a threshold voltage distribution 201 associated with memory cells of slow cell bit lines is judged depending upon a read voltage VR1_Si, and memory cells of fast cell bit lines is judged depending upon a read voltage VR2_Si. For example, a method of judging each program state Si comprises performing a sense operation with a read voltage VR1_Si applied to a selected word line and performing a sense operation with a read voltage VR2_Si applied to the selected word line. Herein, a difference between verify voltages Vvfy1_Si and Vvfy2_Si corresponding to each program state is identical to a difference between read voltages VR1_Si and VR2_Si corresponding to each program state.

A non-volatile memory device according to an exemplary embodiment of the inventive concept is a memory device which retains data even at power-off. With increase in mobile devices such as cellular phone, PDA digital camera, portable gate console, and MP3P, a flash memory device is widely used as not only data storage but also code storage. The flash memory device, further, is capable of being used at home applications such as HDTV, DVD, router, and GSP.

Figure 9:
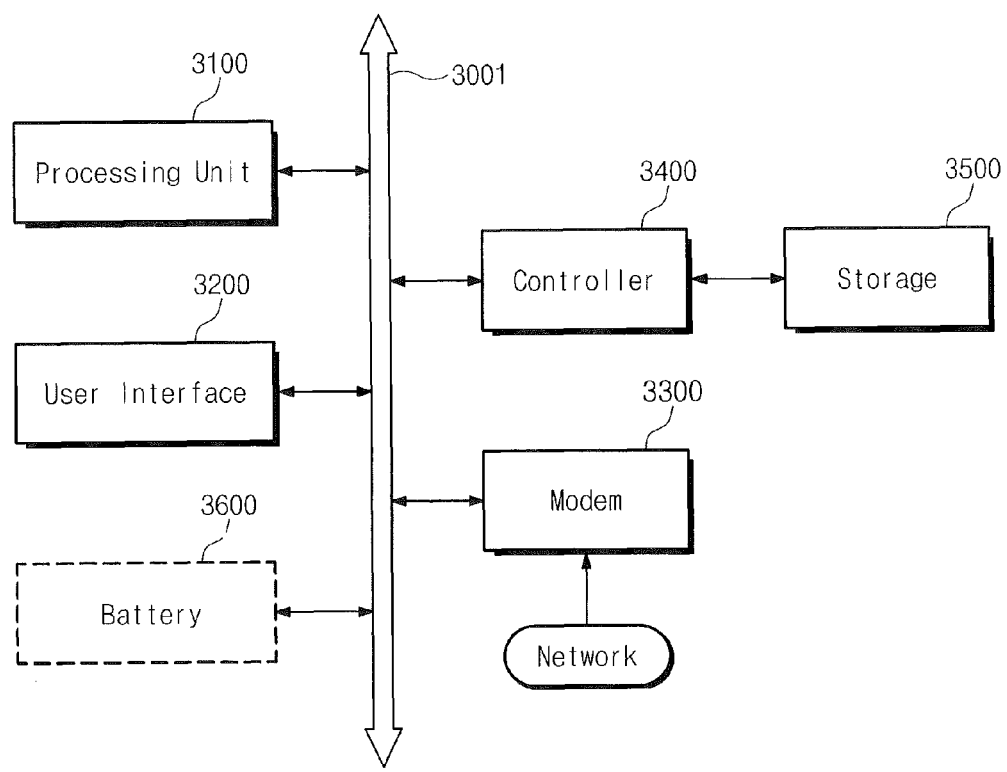
FIG. 9 is a block diagram showing a computing system including a non-volatile memory device according to exemplary embodiments of the inventive concept.

FIG. 9 is a block diagram showing a computing system including a non-volatile memory device according to exemplary embodiments of the inventive concept. A computing system includes a processing unit (for example, CPU) 3100, a user interface 3200, a modem 3300 such as a baseband chipset, a memory controller 3400, and a non-volatile memory device 3500 as a storage media. The non-volatile memory device 3500 may be configured identically with that illustrated in FIG. 1. N-bit data (N being 1 or more integer) processed/to be processed by the processing unit 3100 is stored in the non-volatile memory device 3500 through the memory controller 3400. In the event that the computing system is a mobile device, a battery 3600 is further included in the computing system to supply an operating voltage thereto. Although not illustrated in FIG. 9, the computing system further comprises an application chipset, a camera image processor (CIS), a mobile DRAM, and the like. The memory controller 3400 and the non-volatile memory device 3500 may constitute a Solid State Drive (SSD) which uses a non-volatile memory to store data, for example.

Figure 10:
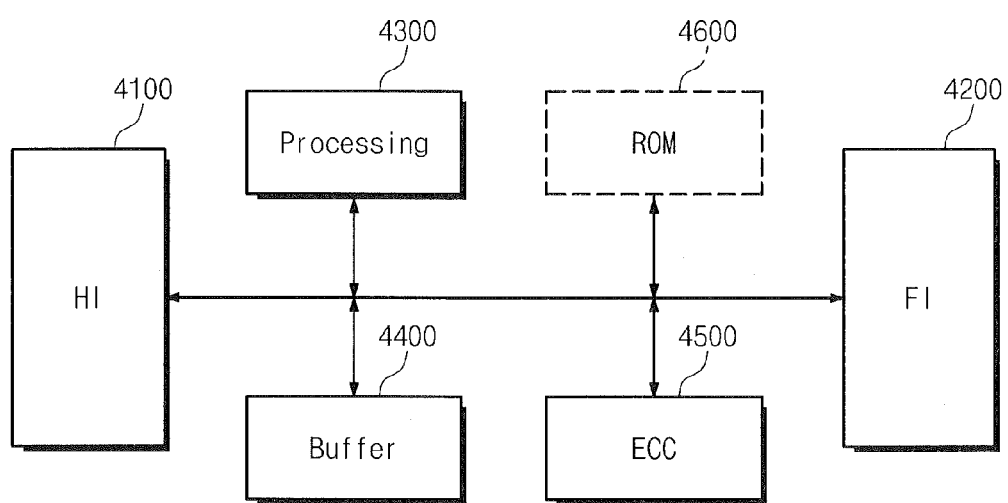
FIG. 10 is a block diagram showing a memory controller illustrated in FIG. 9 according to exemplary embodiments of the inventive concept.

FIG. 10 is a block diagram showing a memory controller illustrated in FIG. 9 according to exemplary embodiments of the inventive concept. Referring to FIG. 10, a controller may be configured to store data in a storage media and read data from the storage media. The controller may include a host interface 4100, a memory/storage interface 4200, a processing unit 4300, a buffer memory 4400, and an error control unit 4500. The host interface 4100 may be configured to interface with an external device (for example, a host), and the storage interface 4200 may be configured to interface with the storage media. The processing unit 4300 may be configured to control an overall operation of the controller. The buffer memory 4400 may be used to temporarily store data to be written in the storage media or data read out from the storage media. Further, the buffer memory 4400 may be used as a work memory of the processing unit 4300. The error control unit 4500 may be configured to detect and correct errors data read from the storage media. As illustrated in FIG. 10, it is understood that there is further provided ROM 4600 for storing code data.

In an exemplary embodiment of the inventive concept, memory cells can be formed of a variable resistance memory cell. An exemplary variable resistance memory cell and a memory device including the same are disclosed in U.S. Pat. No. 7,529,124, the entirety of which is incorporated by reference herein.

In another exemplary embodiment of the inventive concept, memory cells are formed of one of various cell structures having a charge storage layer. Cell structures having a charge storage layer include a charge trap flash structure using a charge trap layer, a stack flash structure in which arrays are stacked in a multiple layer, a source-drain free flash structure, a pin-type flash structure, etc.

A memory device having a charge trap flash structure as a charge storage layer is disclosed in U.S. Pat. No. 6,858,906 and U.S. Publication Nos. 2004/0169238 and 2006/0180851, the entirety of which is incorporated by reference herein. A source-drain free flash structure is KR Patent No. 673020, the entirety of which is incorporated by reference herein.

A flash memory device and/or a memory controller according to the inventive concept may be packaged using various types of packages. For example, a flash memory device or a memory controller according to the inventive concept may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of operating a nonvolatile memory device, comprising:
   programming first and second nonvolatile memory cells having unequal channel widths in a first row of an array of nonvolatile memory cells from respective erased states to respective first programmed states; and
   reading the programmed first and second nonvolatile memory cells using a first read verify voltage to verify that the first nonvolatile memory cell has a threshold voltage associated with its first programmed state and a second read verify voltage, which is greater than or less than the first read verify voltage, to verify that the second nonvolatile memory cell has a second threshold voltage associated with its first programmed state.

2. The method of claim 1, wherein said programming comprises applying a program voltage to a first word line associated with the first row; and wherein said reading comprises applying the first and second read verify voltages in sequence to the first word line.

3. The method of claim 1, further comprising:
   programming third and fourth nonvolatile memory cells having unequal channel widths in a second row of the array of nonvolatile memory cells from respective erased states to respective first programmed states, said third and fourth nonvolatile memory cells having equivalent channel lengths and said first and second nonvolatile memory cells having equivalent channel lengths that are greater than or less than the channel lengths of the third and fourth nonvolatile memory cells.

4. A non-volatile memory device comprising:
   a memory cell array having memory cells arranged of a matrix form of a plurality of bit lines and a plurality of word lines, the plurality of bit lines being divided into fast cell bit lines and slow cell bit lines;
   a plurality of registers each corresponding to the plurality of bit lines;
   switch transistors connecting the plurality of bit lines with the plurality of registers, respectively; and
   control logic configured to control the plurality of registers, wherein during a bit line forcing period following a bit line setup period, registers corresponding to the fast cell bit lines are initialized by the control logic so that a forcing voltage is transferred to the fast cell bit lines with the switch transistors driven with a control voltage.

5. The non-volatile memory device of claim 4, wherein the control voltage is higher than the forcing voltage by a threshold voltage of the switch transistor.

6. The non-volatile memory device of claim 4, wherein the control voltage is set up to be higher than a voltage applied to a bit line during the bit line setup period, by the threshold voltage of the switch transistor.

7. The non-volatile memory device of claim 4, wherein each of the plurality of registers includes at least two latches, a first latch of the at least two latches being configured to store program data provided from an external device and a second latch of the at least two latches being configured to receive the program data from the first latch.

8. The non-volatile memory device of claim 7, wherein the second latches of registers corresponding to the fast cell bit lines are initialized at the bit line forcing period.

9. The non-volatile memory device of claim 7, wherein the second latches of registers corresponding to the slow cell bit lines are not initialized at the bit line forcing period.

10. The non-volatile memory device of claim 4, wherein the plurality of word lines, the plurality of bit lines, and active areas of the memory cells are formed by a double patterning technique.

11. The non-volatile memory device of claim 4, wherein the forcing voltage is determined depending upon a voltage difference between a first threshold voltage distribution and a second threshold voltage distribution, the first threshold voltage distribution being formed of memory cells corresponding to the fast cell bit lines and the second threshold voltage distribution being formed of memory cells corresponding to the slow cell bit lines.

12. The non-volatile memory device of claim 4, wherein the fast cell bit lines and the slow cell bit lines are determined through a test operation, a program method of control logic being set according to the result determined through the test operation.

* * * * *